US006433638B1

(12) United States Patent
Heineke et al.

(10) Patent No.: US 6,433,638 B1
(45) Date of Patent: Aug. 13, 2002

(54) FULLY BALANCED TRANSIMPEDANCE AMPLIFIER FOR HIGH SPEED AND LOW VOLTAGE APPLICATIONS

(75) Inventors: Randolph B. Heineke; Scott Allen Olson, both of Rochester; David Peter Swart, Pine Island, all of MN (US); Gerald Wayne Swift, Rolling Hills Estates, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/655,816

(22) Filed: Sep. 6, 2000

(51) Int. Cl.[7] .............................. H03F 3/45; H03F 1/36; H03F 3/04
(52) U.S. Cl. ..................... 330/260; 330/85; 330/110; 330/311
(58) Field of Search ........................... 330/85, 110, 260, 330/311

(56) References Cited

U.S. PATENT DOCUMENTS

| | | | |
|---|---|---|---|
| 5,039,952 A | * 8/1991 | Dreps et al. | 330/261 |
| 5,343,160 A | 8/1994 | Taylor | 330/9 |
| 5,606,288 A | * 2/1997 | Prentice | 330/260 |
| 5,777,507 A | * 7/1998 | Kaminishi et al. | 327/514 |
| 5,900,779 A | * 5/1999 | Giacomini | 330/252 |
| 6,163,235 A | * 12/2000 | Klemmer | 330/110 |
| 6,307,196 B1 | * 10/2001 | Thompson et al. | 250/214 A |

* cited by examiner

Primary Examiner—Robert Pascal
Assistant Examiner—Patricia T. Nguyen
(74) Attorney, Agent, or Firm—Christopher H. Lynt; Matthew J. Bussan

(57) ABSTRACT

A fully balanced transimpedance amplifier for high speed and low voltage applications is provided. An input stage of the amplifier uses a matched pair of common source connected transistors with sources tied directly to ground to eliminate the Vds overhead usually found in differential pairs. The ground connection minimizes a source resistance noise component, while matching minimizes power supply noise generation and susceptibility for an array of amplifiers. Feedback resistors along with diode connected MESFETS determine the transimpedance of the amplifier. The nonlinearity of diodes helps to soften clipping. Transresistance also determined the noise generated by the amplifier, and the diode connected MESFETS offer lower noise than resistors for the same impedance. Stability is achieved through use of only a single stage of gain in a loop of the input stage, while additional gain is achieved through cascading in the input stage. A differential stage minimizes any difference in amplitude between two sides of the amplifier input stage. Two stages of source followers provide buffering to drive a relatively low impedance load at the output of the amplifier. Single integrated capacitor coupling, for high bandwidth, low noise, low voltage operation with an integrated detector is provided.

15 Claims, 4 Drawing Sheets

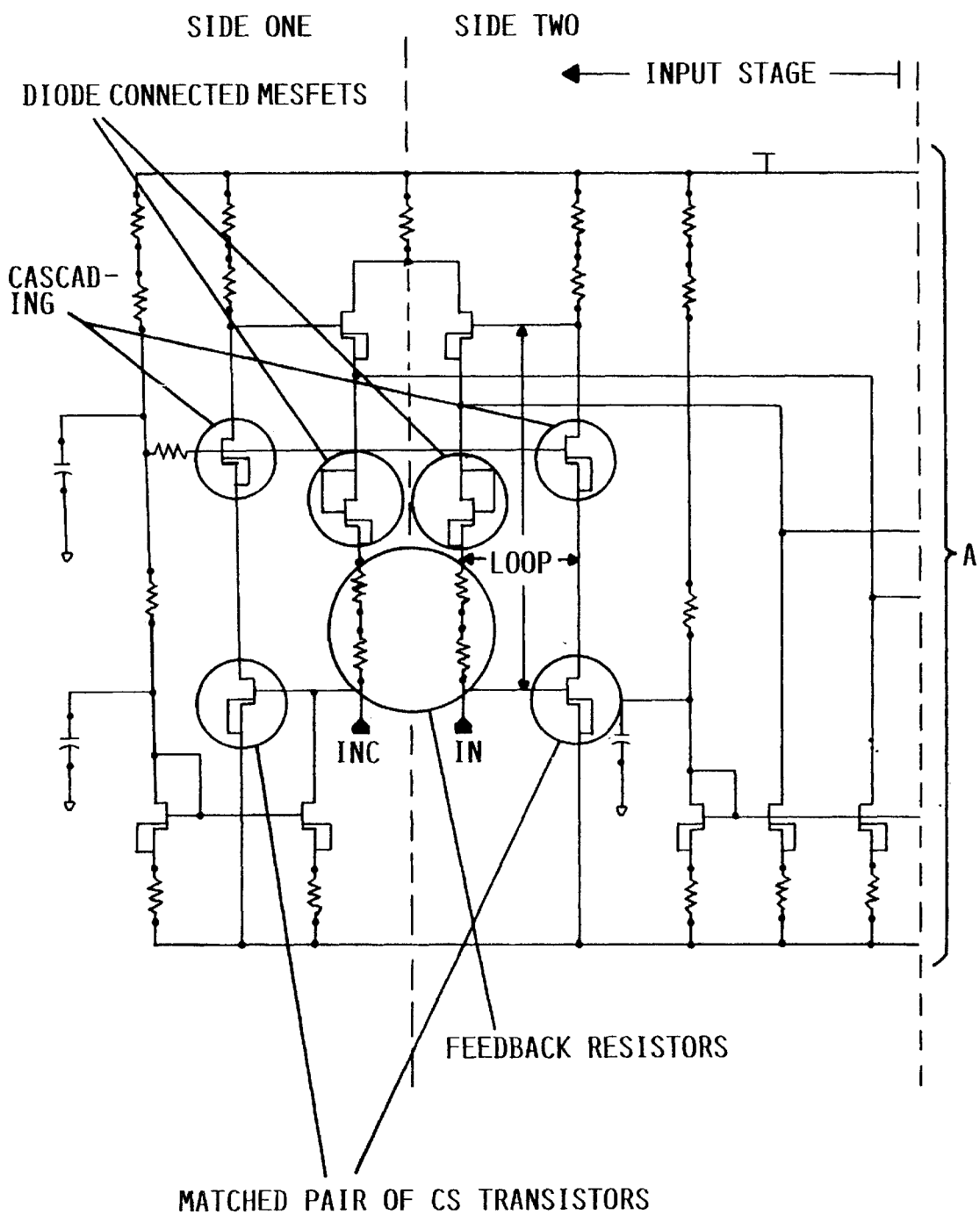
FIG. IA-1

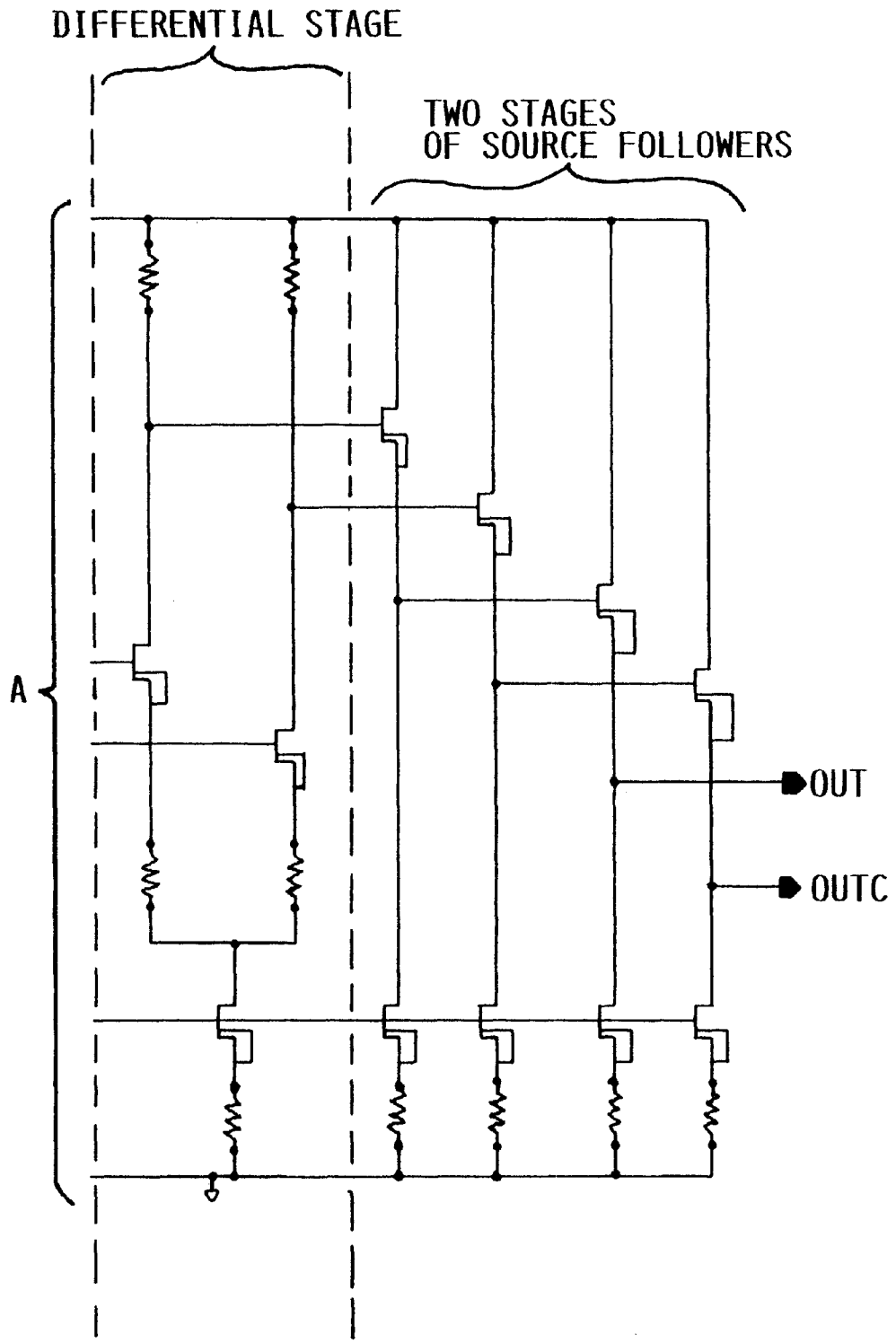
FIG. IA-2

FULLY BALANCED TRANSIMPEDANCE AMPLIFIER FOR HIGH SPEED AND LOW VOLTAGE APPLICATIONS

BACKGROUND OF THE INVENTION

1. Field of the Invention

The invention relates to the field of electronic devices, and in particular, to transimpedance amplifiers.

2. Background Information

Transimpedance amplifiers are known. Fully balanced or differential transimpedance amplifiers are utilized in a variety of applications where it is desirable to convert a current-varying signal into a voltage-varying signal. One such application is within optical receiver systems where the transimpedance amplifier is used to convert the current-varying output signal of a photodetector into a voltage signal that is processed by other circuitry. Although fully balanced or differential transimpedance amplifiers are typically associated with favorable power supply rejection characteristics, they are also often characterized with a relatively low voltage gain, a large low-cutoff frequency, poor noise performance, limited dynamic range, and/or a low bandwidth.

U.S. Pat. No. 5,343,160, by Stewart S. Taylor, entitled "FULLY BALANCED TRANSIMPEDANCE AMPLIFIER WITH LOW NOISE AND WIDE BANDWIDTH" issued Aug. 30, 1994, describes (Abstract) a circuit implementing a fully balanced (differential) transimpedance amplifier with low-noise and wide bandwidth, accomplished by direct coupling the feedback resistors from the outputs of the amplifier to the inputs without the use of a blocking capacitor. An implementation of this transimpedance amplifier device is shown in FIG. 2. As described in the patent, the transimpedance amplifier circuit includes two single-ended input amplifiers that form a first stage and a differential amplifier that forms a second stage common to both input amplifiers. A transistor 210 and a resistor 211 form one input amplifier while transistor 213 and resistor 214 form the other input amplifier. Capacitors 216 and 217 couple the input signal to each input amplifier.

The second stage consists of a differential pair of transistors 220 and 221 and load resistors 222 and 223. Transistors 225, 226 and 227 and diodes 230, 231 and 232 provide proper bias to transistors 220 and 221 with common-mode feedback. This biasing is necessary in some cases to lower the common-mode gain of transistors 220 and 221 since there is an undesired positive common-mode feedback loop around the entire amplifier. Transistors 225 and 226 and diodes 230–232 are biased with current from transistor 235. Transistors 210 and 213 are biased with common-mode feedback from transistors 220, 221, 237, diodes 238 and 239, and resistors 241 and 242. Biasing current is provided by resistors 245 and 247 and transistor 246. Resistors 241 and 242 and capacitors 216 and 217 are chosen consistent with the low frequency cutoff of the circuit and with the size limitations of the integrated circuit. Resistors 241 and 242 should be much larger than feedback resistors 260 and 261 to ensure good noise performance.

The photodetector (MSM in this case) is modeled by current source 250 and capacitor 251. The voltage offset means are implemented with source follower transistors 255 and 256 and level-shifting diodes 257, 258 and 259. Transistors 256 and 285 provide bias current to level-shifting diodes 257–259. Feedback resistors 260 and 261 couple the offset output signals back to the inputs of the photodetector. The output can be taken from the sources or gates of transistors 255 and 256, or from the offset means diodes 257, 258 and 259.

However, a least one drawback of the arrangement described in the patent is that it uses two input capacitors (216, 217) which disadvantageously requires four times as much capacitor area. This is clearly a disadvantage because such space is at a premium in integrated circuitry. Another drawback with the U.S. Pat. No. 5,343,160 patented transimpedance amplifier is that it requires compensation to achieve stability.

Therefore, a need exists for an amplifier which allows for single integrated capacitor coupling, for high bandwidth, low noise, low voltage operation with an integrated detector, that does not have the disadvantages of existing circuits.

SUMMARY OF THE INVENTION

It is, therefore, a principle object of this invention to provide a fully balanced transimpedance amplifier for high speed and low voltage applications.

It is another object of the invention to provide a fully balanced transimpedance amplifier for high speed and low voltage applications that solves the above mentioned problems so that single integrated capacitor coupling, for high bandwidth, low noise, low voltage operation with an integrated detector is achieved.

These and other objects of the present invention are accomplished by the method and apparatus disclosed herein.

According to an aspect of the invention, a fully balanced transimpedance amplifier for high speed and low voltage applications is provided.

According to an aspect of the invention, an amplifier which allows for single integrated capacitor coupling, for high bandwidth, low noise, low voltage operation with an integrated detector is provided.

According to another aspect of the invention, an input stage of the amplifier uses a matched pair of common source connected transistors with sources tied directly to ground to eliminate the Vds overhead usually found in differential pairs. Ground connection minimizes a source resistance noise component, while matching minimizes power supply noise generation and susceptibility for an array of amplifiers.

According to another aspect of the invention, feedback resistors along with diode connected MESFETS determine the transimpedance of the amplifier. The nonlinearity of diodes helps to soften clipping. Transresistance also determines the noise generated by the amplifier. Diode connected MESFETS offer lower noise than resistors for the same impedance.

According to another aspect of the invention, stability is achieved through use of only a single stage of gain in a loop of the input stage. Therefore, in contrast with the patented transimpedance amplifier referred to in the Background section above (U.S. Pat. No. 5,343,160), no additional compensation is required to achieve stability.

According to another aspect of the invention, additional gain is achieved through cascading in the input stage.

According to another aspect of the invention, a differential stage minimizes any difference in amplitude between two sides of the amplifier input stage.

According to another aspect of the invention, two stages of source followers provide buffering to drive a relatively low impedance load, e.g., a 50 Ohm load at the output of the amplifier.

These and other aspects of the invention will become apparent from the detailed description set forth below.

BRIEF DESCRIPTION OF THE DRAWINGS

FIGS. 1A and 1B illustrate schematically a fully balanced transimpedance amplifier according to an exemplary embodiment of the present invention.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 1B:
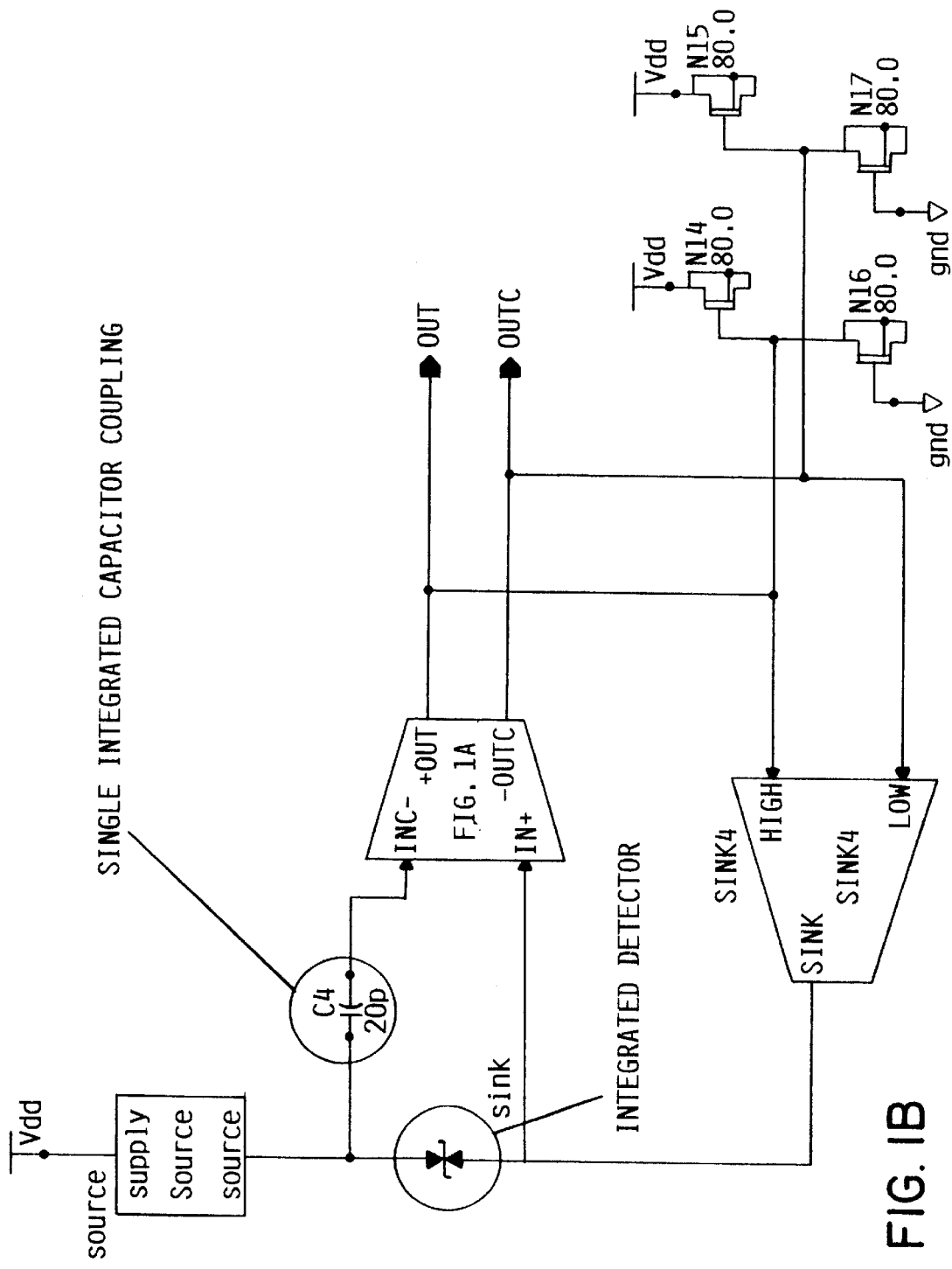
Figure 2:
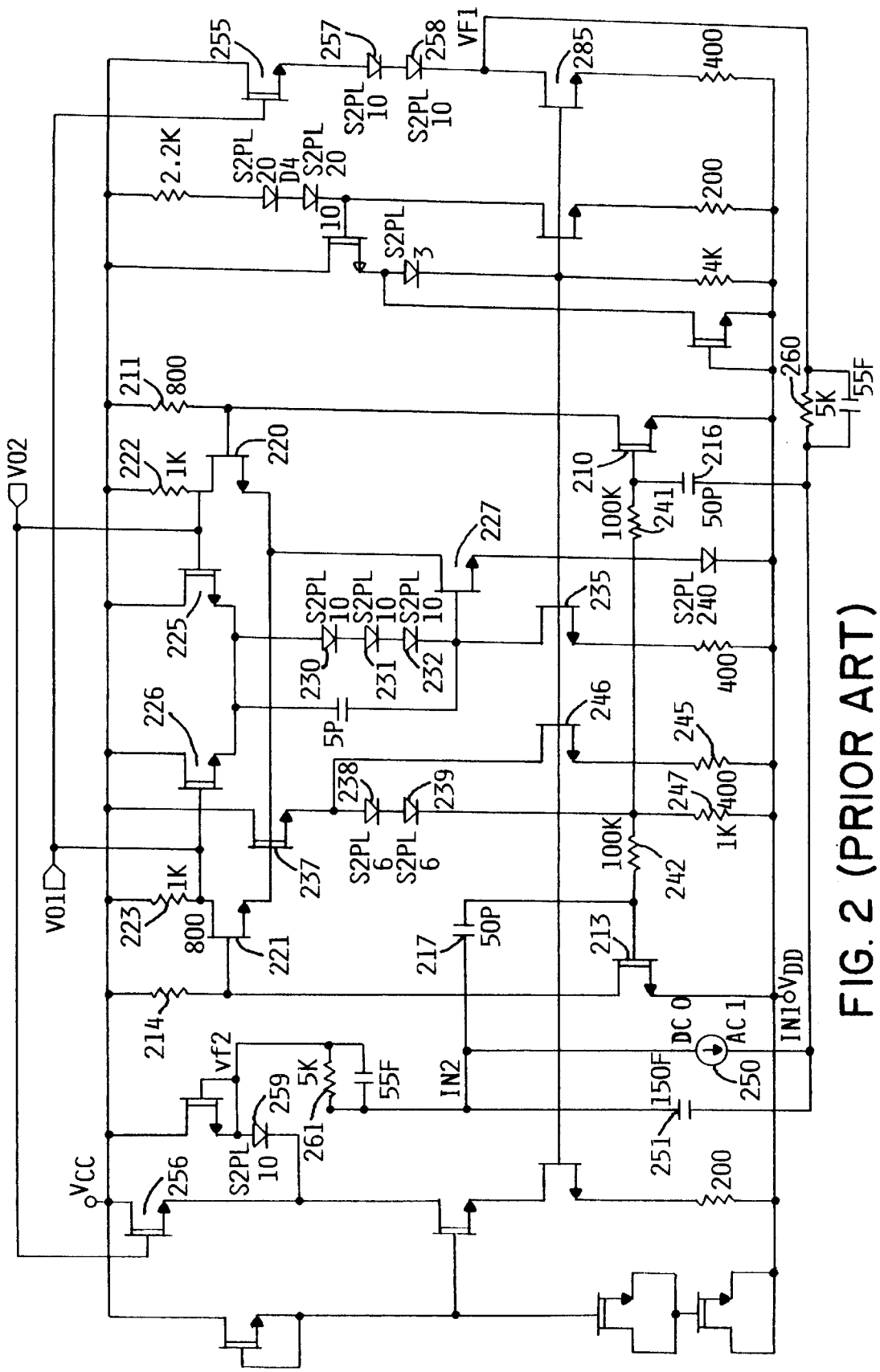
FIG. 2 illustrates a known transimpedance amplifier according to U.S. Pat. No. 5,343,160.

A fully balanced transimpedance amplifier for high speed and low voltage applications according to an exemplary embodiment of the invention is illustrated in FIGS. 1A and 1B. Single integrated capacitor coupling for high bandwidth, low noise, low voltage operation with an integrated detector is provided, as shown in FIG. 1B.

FIG. 1A is a schematic circuit diagram of a transimpedance amplifier according to an exemplary embodiment of the present invention. The circuitry is divided into three functional stages for purposes of explanation: an input stage, a differential stage, and a source follower stages (actually, two stages of source followers).

The input stage of the amplifier is shown at the left side of FIG. 1A divided into two sides. The input stage uses a matched pair of common source (CS) connected transistors (one transistor on each input stage side) with sources tied directly to ground. This arrangement eliminates the Vds overhead usually found in differential pairs. The ground connection minimizes the source resistance noise component, while the matching minimizes power supply noise generation and susceptibility for an array of amplifiers.

The feedback resistors along with diode connected MESFETS determine the transimpedance of the amplifier. The nonlinearity of diodes (the diode connected MESFETS) may help soften clipping, i.e., input signal amplitude distortion. Transresistance also determines amplifier generated noise, and the diode connected MESFETS generate less noise than comparable resistors providing the same impedance. Reducing amplifier generated noise is an important design goal in communications systems which are already susceptible to external noise by virtue of the distances and the media through which the signals must travel, for example.

Amplifier stability, i.e., freedom from undesirable oscillations, is achieved through use of only a single stage of gain in a loop (the "loop" is labeled for side two of the input stage in FIG. 1A). Additional gain is achieved through cascading as illustrated in FIG. 1A.

The differential stage of the transimpedance amplifier is also illustrated in FIG. 1A. This stage minimizes any difference in amplitude between the two sides of the input stage of the amplifier. Such differences in amplitude are undesirable because they are a form of signal distortion which could introduce errors into the ultimate communications signal interpretation.

The next stage of the transimpedance amplifier of FIG. 1A is shown on the right side of the figure and provides the output drive for a load (not shown). Actually, two stages of source followers are provided in this stage. The two stages of source followers provide buffering to drive a relatively low impedance load, e.g., a load of 50 Ohms at the output.

FIG. 1B illustrates schematically an exemplary embodiment of the feature of single integrated capacitor coupling of a detected signal at one of the differential inputs (INC) of the transimpedance amplifier of FIG. 1A. This feature provides for high bandwidth, low noise, low voltage operation with an integrated detector (MSM).

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. An amplifier having an input stage, the input stage comprising:
   input means for minimizing noise generation and susceptibility of the amplifier; and
   feedback means for determining a transimpedance of the amplifier, wherein the feedback means comprises feedback resistors and diode connected MESFETS.

2. The amplifier according to claim 1, wherein the input means comprises a differential input having a matched pair of common source connected transistors with sources tied directly to ground.

3. The amplifier according to claim 1, wherein the input stage has first and second sides, wherein each side has a single stage of gain in a loop, and wherein additional gain is provided by cascading means.

4. The amplifier according to claim 1, wherein the input stage has first and second sides, the amplifier further comprising:
   a differential stage for minimizing any difference in amplitude between the first and second sides of the input stage.

5. The amplifier according to claim 4, wherein the amplifier further comprises buffering means for driving a load of the amplifier.

6. An amplifier comprising:
   an input stage that has first and second sides, the input stage comprising
      input means for minimizing noise generation and susceptibility of the amplifier, and
      feedback means for determining a transimpedance of the amplifier;
   a differential stage for minimizing any difference in amplitude between the first and second sides of the input stage; and
   buffering means for driving a load of the amplifier, wherein the buffering means comprises two stages of source followers for driving a relatively low impedance load.

7. The amplifier according to claim 1, further comprising:
   an integrated detector; and
   coupling means, for coupling a detected signal from the integrated detector to the amplifier input stage.

8. The amplifier according to 7, claim wherein the coupling means comprises a single integrated capacitor.

9. An amplifier comprising:
 an input stage having means to eliminate drain-source voltage overhead;
 a differential stage; and
 an output stage.

10. An amplifier comprising:
 an input stage having means to eliminate drain-source voltage overhead;
 a differential stage; and
 an output stage;
 wherein the input stage comprises:
  first and second sides;
  wherein the means to eliminate drain-source voltage overhead comprises a matched pair of common source connected transistors with sources tied directly to ground, a respective one of the transistors being in one of the first and second sides of the input stage; and
  a respective feedback loop in each of the first and second sides of the input stage, each feedback loop including feedback resistors and at least one diode connected transistor;
  wherein a single stage of gain is provided in each of the loops to achieve stability; and
  wherein additional gain is provided by cascading.

11. The amplifier according to claim 10, wherein the at least one 2 diode connected transistor comprises a diode connected MESFET.

12. The amplifier according to claim 9, wherein the differential stage comprises:
 means for minimizing any differences in amplitude between sides of the input stage.

13. An amplifier comprising:
 an input stage having means to eliminate drain-source voltage overhead;
 a differential stage; and
 an output stage, wherein the output stage comprises:
  two stages of source followers for driving a relatively low impedance load.

14. The amplifier according to claim 9, further comprising:
 coupling means for coupling a signal into the input stage.

15. The amplifier according to claim 14, wherein the coupling means comprises a single integrated capacitor.

* * * * *